United States Patent [19]

Fujita et al.

[11] 4,074,274

[45] Feb. 14, 1978

[54] MULTIPOINT RECORDER

[75] Inventors: Hisaya Fujita; Nobuo Kaieda; Setsuo Sato; Kenji Kawakami, all of Musashino, Japan

[73] Assignee: Yokogawa Electric Works, Ltd., Tokyo, Japan

[21] Appl. No.: 707,819

[22] Filed: July 22, 1976

[30] Foreign Application Priority Data

July 31, 1975    Japan .................................. 50-93506

[51] Int. Cl.² ........................ G01D 9/00; H01H 19/58
[52] U.S. Cl. .................................... 346/34; 200/11 G
[58] Field of Search .............. 346/34, 62; 200/11 DA, 200/11 G; 340/324 B, 324 S, 325, 379

[56] References Cited

U.S. PATENT DOCUMENTS

| | | | |
|---|---|---|---|
| 3,093,003 | 6/1963 | Cochinal et al. ................. | 346/34 X |
| 3,316,554 | 4/1967 | Parker, Jr. et al. ................ | 346/34 |
| 3,321,767 | 5/1967 | Fulchino ........................... | 346/62 X |
| 3,553,712 | 1/1971 | MacMullan et al. .............. | 346/34 |
| 3,576,582 | 4/1971 | Smith, Jr. .......................... | 346/34 |
| 3,683,404 | 8/1972 | Dennis et al. ..................... | 346/34 |
| 4,038,504 | 7/1977 | McAnulty et al. ........... | 200/11 G X |

OTHER PUBLICATIONS

Wolfheimer, A. D., Station Selection Device, Jan. 1967, IBM Technical Disclosure Bulletin, vol. 9, No. 8, p. 975.

Primary Examiner—George H. Miller, Jr.
Attorney, Agent, or Firm—Parmelee, Johnson, Bollinger & BZramblett

[57] ABSTRACT

A multipoint recorder of the type used to monitor a number of measuring instruments and including a mechanism having a group of contacts for sequentially selecting signals from a number of measuring points, a self-balancing circuit having a balancing motor for intermittently measuring each of said signals, and an indicating and recording mechanism operated in synchronism with said selection mechanism for indicating and recording, e.g., on a strip chart, the group of measurements supplied by said self-balancing circuit. The multipoint recorder is characterized by a group of auxiliary contacts in said selection mechanism interspersed with the group of measuring point selection contacts, said auxiliary contacts being switched with a given delay behind switching of the measuring point selection contacts so that the auxiliary contacts are sequentially closed as the selection mechanism switches between measuring point selection contacts. In response to the switching of said auxiliary contacts, means are provided for locking said balancing motor or performing alarm operations or other functions while the selection mechanism switches from one measuring point to another.

11 Claims, 14 Drawing Figures

MULTIPOINT RECORDER

BACKGROUND OF THE INVENTION

1. Field of the Invention

The present invention relates generally to multipoint recorders for sequentially monitoring a number of measuring points through a selection mechanism, measuring the input signals, and recording the measured results, as on a strip chart. More particularly, the invention relates to multipoint recorders having a selection mechanism with a group of contacts switched in sequence to receive signals from a number of measuring points, a self-balancing circuit comprising a balancing motor for intermittently measuring the signals, and an indicating and recording mechanism synchronized with the measuring point selection mechanism for recording the measured signals.

2. Description of the Prior Art

In a multipoint recorder it is often the case that the input opens, though momentarily, when switching from one measuring point to another, causing the self-balancing circuit to misoperate. One prior art solution to this problem has been to use a gear train to interlock a cam with the measuring point selection mechanism. Through the cam, a balancing switch is driven to open or short the output of an amplifier of the self-balancing circuit and thereby lock the balancing motor during measuring point switching and thus prevent the self-balancing circuit from being misoperated. This approach, however, is not very satisfactory because the balancing motor locking mechanism is unduly intricate in construction and large in size and, in addition, requires a considerable effort to establish proper synchronism between balancing motor locking and measuring point switching.

In addition, a multipoint recorder is often equipped with a multipoint alarm mechanism which generates an alarm signal when a measured value exceeds a predetermined set point. In prior art recorders, a gear train is used to interlock a cam with the measuring point selection mechanism, and an alarm is generated through a mechanism associating a contact spring in combination with the cam. This extra alarm mechanism, however, is intricate in construction and large in size. In addition, careful adjustments are required to establish synchronism between measuring point switching and alarm action.

Because of the foregoing techniques, prior art multipoint recorders have limited space where the measuring point selection mechanism is mounted because a gear train must be provided for each optional mechanism with which the measuring point selection mechanism is to be synchronized.

For these reasons, prior art multipoint recorders have been unable to satisfactorily supply synchronized motor lock out and alarm functions.

SUMMARY OF THE INVENTION

It is a principal object of the present invention to provide an improved multipoint recorder. Specific objects of the invention are to provide a multipoint recorder which is simple in construction, and at the same time capable of providing synchronized operation for various functions such as motor locks, alarms, and the like. Still another object of the present invention is to provide a multipoint recorder which is more satisfactory for commercial use.

In a particular embodiment of the invention to be described hereinbelow in detail, the multipoint recorder is of the type including a selection mechanism having a group of contacts for sequentially selecting signals from a number of measuring points, a self-balancing circuit having a balancing motor for intermittently measuring said signals, and an indicating and recording mechanism operated in synchronism with the selection mechanism for indicating and recording the measurements supplied from the self-balancing circuit. In accordance with the invention, a group of auxiliary contacts are provided on the selection mechanism interspersed with and offset from the measurement point selection contacts so that they are sequentially closed as the selection mechanism switches between successive measurement point selection contacts. In one embodiment, measuring point selection contacts and auxiliary contacts are provided concentrically and alternately on a printed circuit board, with a rotary movable contact closing the auxiliary contact and measuring point selection contact simultaneously in moving between successive measuring point selection contacts to keep the auxiliary contact closed throughout the transition. In response to closing of the auxiliary contacts, means are provided for locking the balancing motor, or for performing an alarm function, or for displaying and identifying the measuring point being recorded or for which an alarm has been given, or for activating another function.

The foregoing arrangement is simple in construction and is automatically synchronized without any adjustments being necessary. Many different functions can be operated from the auxiliary contacts, and alarm comparisons can be taken reliably while the balancing motor is locked at the end of a measurement.

Other objects, aspects and advantages of the invention will be pointed out in, or will be apparent from, the detailed description below.

DESCRIPTION OF THE DRAWINGS

FIG. 2 is a perspective view showing the construction of a switch used for the multipoint recorder of the present invention;

DESCRIPTION OF THE PREFERRED EMBODIMENTS

Figure 1:
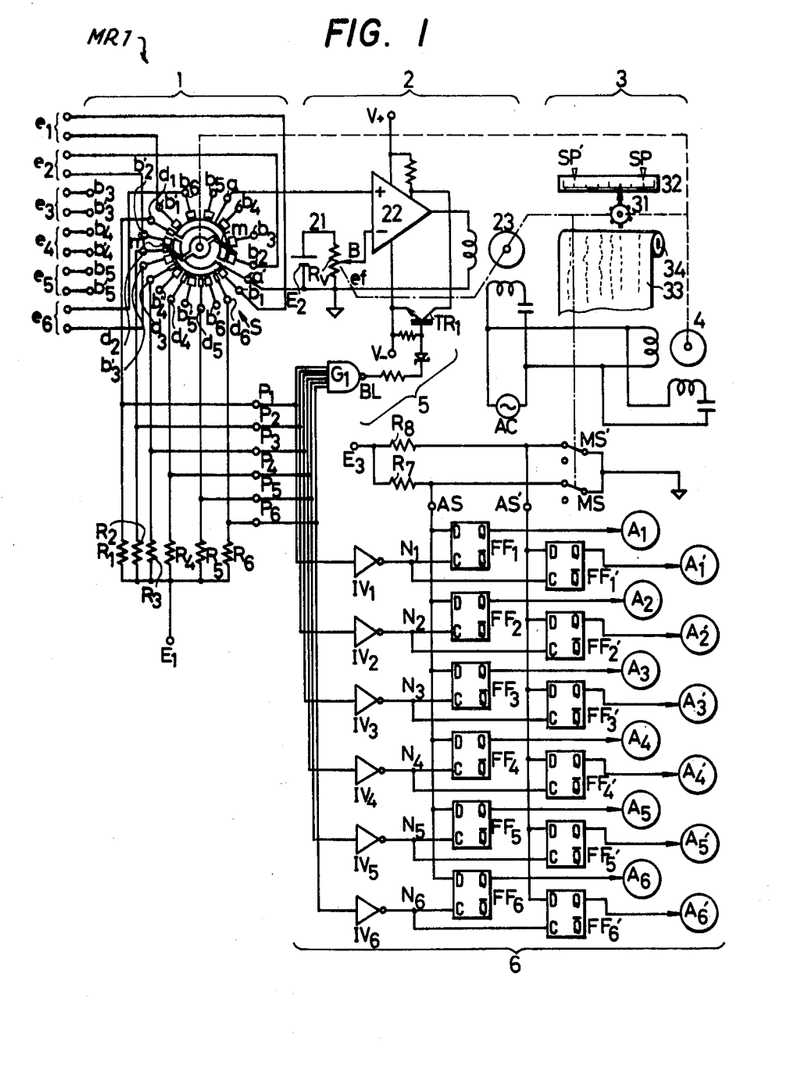
FIG. 1 is a schematic circuit diagram showing a multipoint recorder constructed according to the present invention.

FIG. 1 illustrates a multipoint recorder MR1 constructed according to the present invention, and comprising a selection mechanism 1, a self-balancing circuit 2, an indicating and recording mechanism 3, a synchronous motor 4, a balancing motor lock circuit 5, and an alarm circuit 6.

Figures 2A, 2B, 2C:
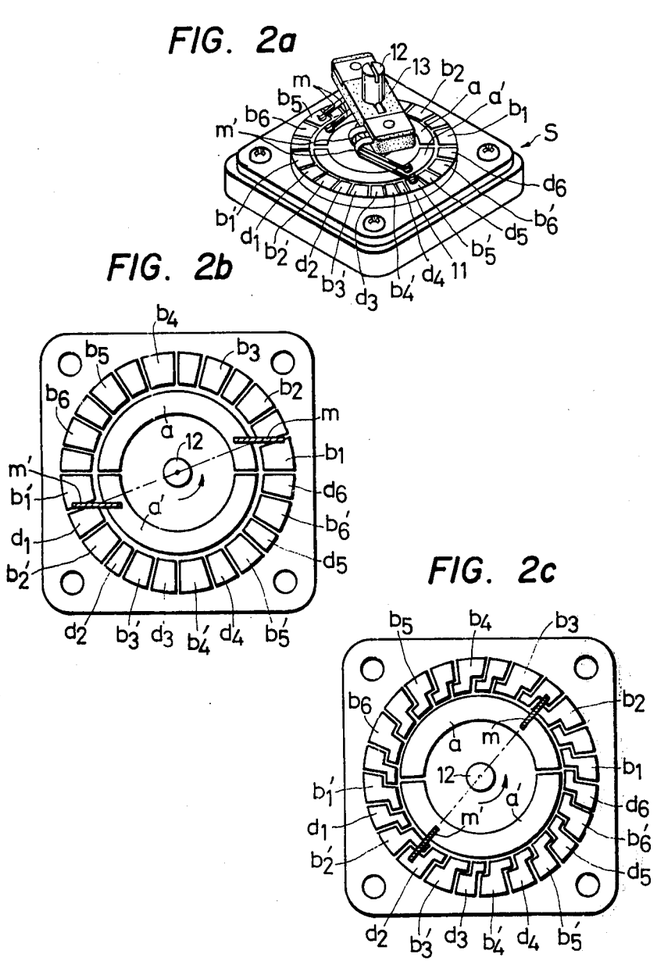
FIG. 2a is a perspective view showing the construction of a switch used for the multipoint recorder of the present invention.
FIG. 2b is a plan view of the switch of FIG. 2a with portions removed for clarity of illustration of the contacts thereof.
FIG. 2c is a plan view similar to FIG. 2b showing another contact arrangement.
Figure 3:
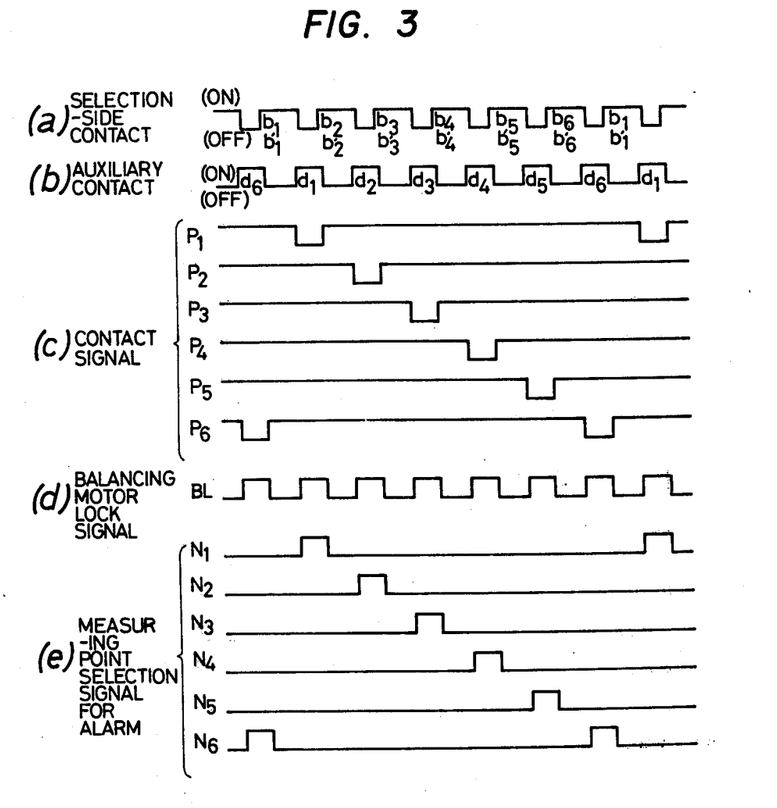
FIG. 3 is a timing chart illustrating the operation of the multipoint recorder of FIG. 1.

The selection mechanism 1 has a switch S of printed circuit board construction in which, as shown in FIG. 2, fixed common contacts $a$ and $a'$, fixed selection contacts $b_1$ to $b_6$ and $b_1'$ to $b_6'$, and fixed auxiliary contacts $d_1$ to $d_6$ are positioned concentrically in a printed pattern on a circuit board or substrate 11, and moveable contacts $m$ and $m'$ for connecting the fixed contacts are carried by a rotating shaft 12 upon an insulating arm 13. The auxiliary fixed contacts $d_1$ to $d_6$ are located between the fixed selector contacts $b_1'$ to $b_6'$ so that each of the moveable contacts $m$ and $m'$ can come in contact with the two contacts simultaneously as shown in FIGS. 2b and 2c. In the arrangement shown in FIG. 2b, the fixed contacts are radial and moveable contacts $m$ and $m'$ are angled with respect to the radius to permit both fixed contacts to be contacted at once. In the arrangement shown in FIG. 2c, the moveable contacts $m$ and $m'$ are radial while the fixed contacts are offset with respect to the radius to permit simultaneous contact. The rotating shaft 12 is rotated at a constant speed or with regular intermittent or stepping motion, causing the moveable contacts $m$ and $m'$ to slide on the fixed contacts. Thus the fixed selection contacts $b_1$ to $b_6$ and $b_1'$ to $b_6'$ are closed in sequence as shown graphically in FIG. 3(a), and the auxiliary fixed contacts $d_1$ to $d_6$ are closed in sequence at a given time lag behind the closing of the fixed selection contacts as shown in FIG. 3(b).

In multipoint recorder MR1, the rotating shaft of the switch S is rotated at a constant speed by the synchronous motor 4 to switch in sequence a number of measuring points connected to the selection-side fixed contacts. Measured values $e_1$ to $e_6$ thus selected are supplied sequentially to the self-balancing circuit 2. A DC source $E_1$ connected in common to the auxiliary fixed contacts $d_1$ to $d_6$ through resistors $R_1$ to $R_6$ is connected in sequence to a reference point. Address-designated contact signals $P_1$ to $P_6$ are supplied to the balancing motor lock circuit 5 and to the alarm circuit 6 at times which lag a given amount behind the switching of one measuring point to another.

The self-balancing circuit 2 comprises a comparison value generating circuit 21 having a resistor $R_V$ and a DC source $E_2$, an amplifier 22, and a balancing motor 23. The amplifier 22 amplifies the difference between a comparison value $e_f$ and a measured value ($e_1$ through $e_6$) selected by the selection mechanism 1. The resultant amplifier output drives the balancing motor 23, causing a brush B to slide on the slide resistor $R_V$ and thereby balancing the comparison value and the measured value.

The indicating and recording mechanism 3 has a dotting mechanism 31, a scale plate 32, a recording chart 33, and a chart feed roller 34. Driven by the balancing motor 23, the dotting mechanism 31 makes a traverse above the chart 33 with the movement of the brush B and intermittently dots a measured value supplied from the selected measuring point. The position of the dotting mechanism, i.e., the measured value, is indicated on the scale plate 32.

The scale plate 32 has set indexes SP and SP' for high and low alarm set points $e_a$ and $e_a'$ respectively. Driven by the synchronous motor 4, the chart feed roller 34 feeds the chart 33 at a constant speed. The rotating torque of the synchronous motor 4 is transmitted to the dotting mechanism 31, causing its dotting pin to rotate by a given angle, at regular time intervals, in synchronism with the selection mechanism 1.

The balancing motor lock circuit 5 comprises a NAND gate $G_1$ and a transistor switch $TR_1$. Receiving contact signals $P_1$ to $P_6$ from the selection mechanism 1, the NAND gate $G_1$ generates a balancing motor lock signal BL which, as shown in FIG. 3(d), overlaps the period between closings of successive selection contacts $b_1'$ to $b_2'$, $b_2'$ to $b_3'$, etc. When the transistor switch $TR_1$ is driven by the signal BL into an on state, a bias circuit of the amplifier 22 ceases operating and thereby locks the balancing motor 23.

The alarm circuit 6 comprises alarm contacts MS and MS' equipped to the set indexes SP and SP', inverters $IV_1$ to $IV_6$, D-type flip-flops $FF_1$ to $FF_6$ and $FF_1'$ to $FF_6'$, and alarm displays $A_1$ to $A_6$ and $A_1'$ to $A_6'$. The alarm contacts MS and MS' are normally closed, connecting a DC source $E_3$ to a reference point. When the dotting mechanism 31 steps over the set index SP or SP', the alarm contact MS or MS' opens, thereby generating an abnormality detecting signal AS or AS'. The signal AS is applied in common to the D input terminals of the D-type flip-flops $FF_1$ to $FF_6$. The signal AS' is applied in common to the D input terminals of the D-type flip-flops $FF_1'$ to $FF_6'$. The contact signal $P_1$ from the selection mechanism 1 is applied in common to the C input terminals of the D-type flip-flops $FF_1$ and $FF_1'$ through the inverter IV. In a similar fashion, the contact signals $P_2$ to $P_n$ are applied respectively to the C input terminals of the D-type flip-flops $FF_2$ to $FF_6$ and $FF_2'$ to $FF_6'$ through the inverters $IV_2$ to $IV_6$. These flip-flops are selected in sequence by the signals $P_1$ to $P_6$ and transfer to the outputs Q the states of their inputs present when they are selected. When, for example, the flip-flop $FF_1$ is selected by the contact signal $P_1$, this flip-flop generates an output Q if the abnormality detection signal AS is present at its D input. This state remains unchanged until the state of the D input is transferred to its output Q by the signal $P_1$ generated one cycle after the preceding one. The outputs Q of the D-type flip-flops $FF_1$ to $FF_6$ and $FF_1'$ to $FF_6'$ are displayed on the alarm displays $A_1$ to $A_6$ and $A_1'$ to $A_6'$ respectively.

The multipoint recorder MR1 of FIG. 1 operates in the following manner. Assume that the moveable contacts $m$ and $m'$ of the switch S of the selection mechanism 1 are in contact only with the fixed selection contacts $b_1$ an $b_1'$, that is, the first measuring point is selected. The signal $e_1$ from the first measuring point is measured by the self-balancing circuit 2 and indicated and recorded by the indicating and recording mechanism 3. A given time after the first measuring point has been selected (i.e., when the comparison value $e_f$ has balanced the measured value $e_1$), the moveable contacts $m$ and $m'$ of the switch S slide into contact with not only the fixed selection contacts $b_1$ and $b_1'$, but also with the auxiliary fixed contact $d_1$, causing a contact signal $P_1$ to be generated in the state the first measuring point is selected. By means of the contact signal $P_1$, the balancing motor lock circuit 5 is operated to lock the balancing motor 23. Concurrently, the D-type flip-flops $FF_1$ and $FF_1'$ of the alarm circuit 6 are selected, and, if an abnormality detection signal AS (or AS') is present, the output Q of the flip-flop $FF_1$ (or $FF_1'$) is applied to the alarm display $A_1$ (or $A_1'$) which in turn identifies the first measuring point and displays an alarm.

Then the movable contacts $m$ and $m'$ leave the fixed selection contacts $b_1$ and $b_1'$ and, while still in contact with the auxiliary contact $d_1$, slide into contact with the fixed contacts $b_2$ and $b_2'$ whereby the first measuring point is switched to the second one. Since the moveable contacts retain contact with the auxiliary fixed contact $d_1$, the balancing motor continues to be locked and thus the self-balancing circuit 2 is prevented from being misoperated as one measuring point is switched to another. When the moveable contacts $m$ and $m'$ leave the auxiliary fixed contact $d_1$, the balancing motor 23 is unlocked. Then the signal $e_2$ from the second measuring point is measured by the self-balancing circuit 2, and the measured result is indicated and recorded by the indicating and recording mechanism 3. A given time after the selection of the second measuring point, the moveable contacts $m$ and $m'$ slide in contact with the selection contacts $b_2$ and $b_2'$ and the auxiliary contact $d$ simultaneously A contact signal $P_2$ is generated in the state the second measuring point is selected, causing the balancing motor to be locked. Concurrently, alarm circuit 6 indicates whether the second measuring point is abnormal.

In this manner a number of measuring points are selected in sequence, measured by the self-balancing circuit and indicated and recorded by the indicating and recording mechanism. In this sequence of operation, the balancing motor is locked by a contact signal, thus preventing the self-balancing circuit from being misoperated while switching from one measuring point to another. At the same time, abnormality conditions of a number of measuring points are examined and any abnormal measuring point is displayed by the alarm circuit 6.

Figure 4:
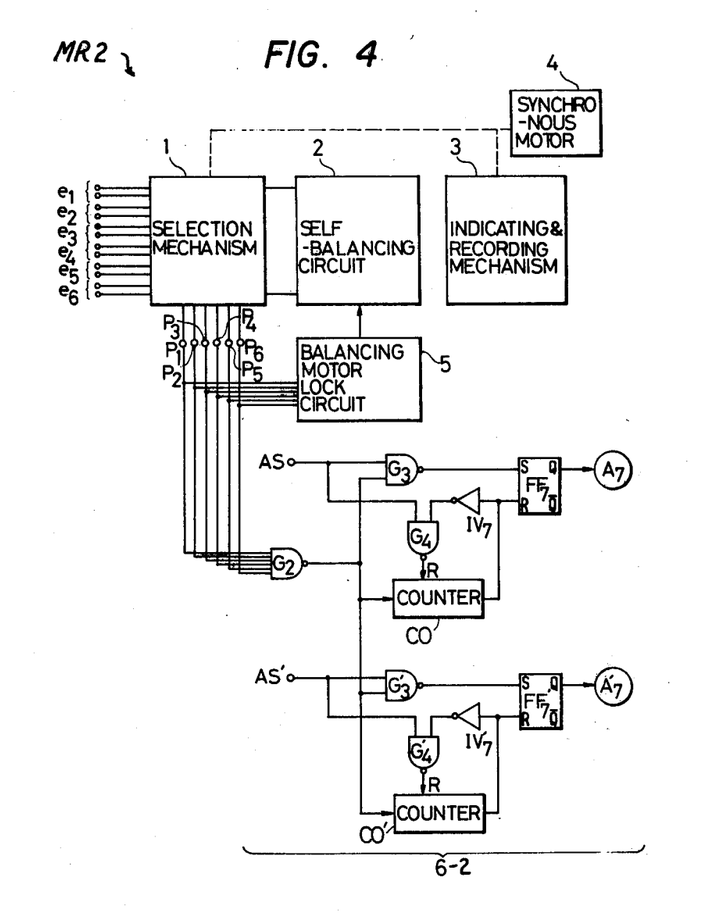
FIGS. 4 and 5 are circuit diagrams showing other embodiments of the invention.

In the multipoint recorder $MR_1$, the bias circuit of the amplifier 22 is controlled by a contact signal for the balancing motor lock 5. Alternatively, the output of the amplifier 22 may be opened or shorted or the output of the voltage amplifier part of the amplifier may be opened or shorted by the contact signal. Similarly, instead of D-type flip-flops which constitute the alarm circuit 6, other logical elements may be used for the foregoing measuring point identifying alarm.

Where a non-identifying alarm is acceptable, a multipoint recorder $MR_2$ with an alarm circuit 6-2 may be constructed as shown in FIG. 4, comprising counters CO and CO', NAND gates $G_2$, $G_3$, $G_4$, $G_3'$ and $G_4'$, flip flops $FF_7$ and $FF_7'$, and inverters $IV_7$ and $IV_7'$. When an abnormality detection signal AS (or AS') is generated, the flip-flop $FF_7$ (or $FF_7'$) is set and an alarm display $A_7$ (or $A_7'$) is activated. Concurrently, the counter CO (or CO') is reset. The counter then generates an output with a delay of one cycle counted from the generation of the next contact signal. When this output is generated, the counter CO (or CO') is returned to its initial state. At the same time, the flip-flop $FF_7$ (or $FF_7'$) is reset if no abnormality detection signal AS (or AS') is present, causing the alarm display $A_7$ (or $A_7'$) to cease operating.

Figure 5:
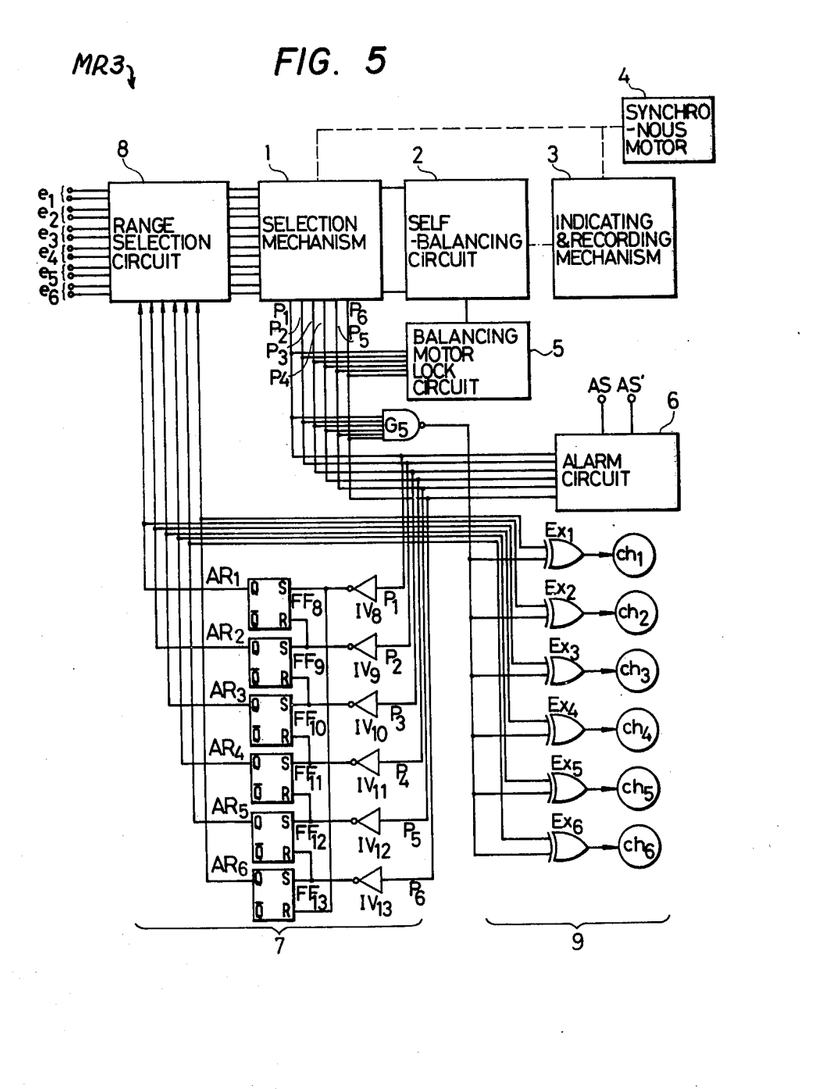
Figure 6:
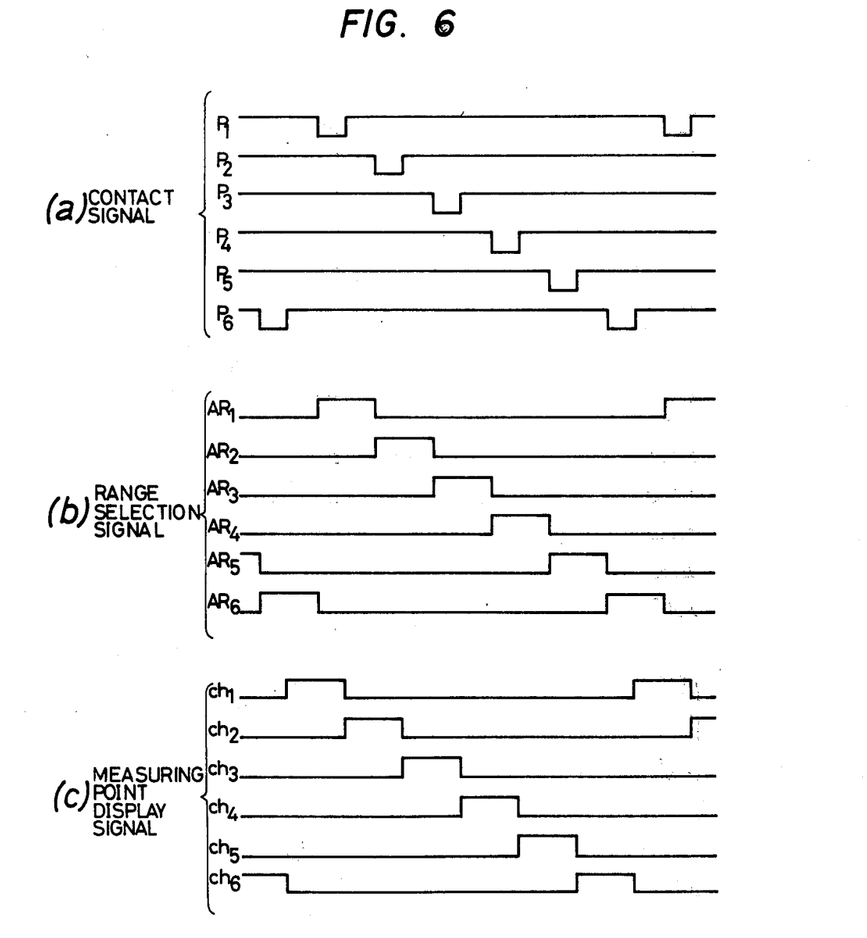
FIG. 6 is a timing chart illustrating the operation of the multipoint recorder shown in FIG. 5.

In the multipoint recorder $MR_3$ shown in FIG. 5, auxiliary contact signals are used to develop a display of measuring points, and to accomplish the selection of ranges for the input signals $e_1$ through $e_6$. The circuit shown in FIG. 5 comprises a range selection signal generating circuit 7, a range selection circuit 8, and a measuring point display circuit 9. The range selection signal generating circuit 7 comprises inverters $IV_8$ to $IV_{13}$, and flip-flops $FF_8$ to $FF_{13}$. When a contact signal $P_1$ as shown in FIG. 6(a) is generated, the flip-flop $FF_8$ is set through the inverter $IV_8$, causing a range selection signal $AR_1$ to be generated. At the same time, the flip-flop $FF_{13}$ is reset to stop generating a range selection signal $AR_6$. In this manner, range selection signals $AR_1$ to $AR_6$ are generated when contact signals $P_1$ to $P_6$ are applied. By means of each range selection signal, the range selection circuit 8 is driven to select a range automatically. It is not necessary to switch one range to another for each measuring point, but a range may, for example, be switched for the first to third measuring points and for the fourth to sixth measuring points. In this case, range selection signals $AR_1$ to $AR_3$, and $AR_4$ to $AR_6$ would be taken out in a group, through an OR circuit and applied to the range selection circuit 8. The range selection circuit 8 may be inserted between the comparison value generating circuit 21 of the self-balancing circuit 2 and the amplifier 22.

In multipoint recorder $MR_3$, the measuring point display circuit 9 comprises exclusive OR circuits $EX_1$ to $EX_6$ and measuring point displays $ch_1$ to $ch_6$. A range selection signal $AR_6$ and contact signals $P_1$ to $P_6$ are applied through a NAND gate $G_5$ to the exclusive OR circuit $EX_1$, causing a measuring point display signal as shown in FIG. 6(c) to be applied to the display $ch_1$ where the selected first measuring point is displayed. In a similar manner, measuring point display signals from the exclusive OR circuits $EX_2$ to $EX_6$ are applied to the displays $ch_2$ to $ch_6$ to cause the second to sixth measuring points to be displayed.

Figure 7:
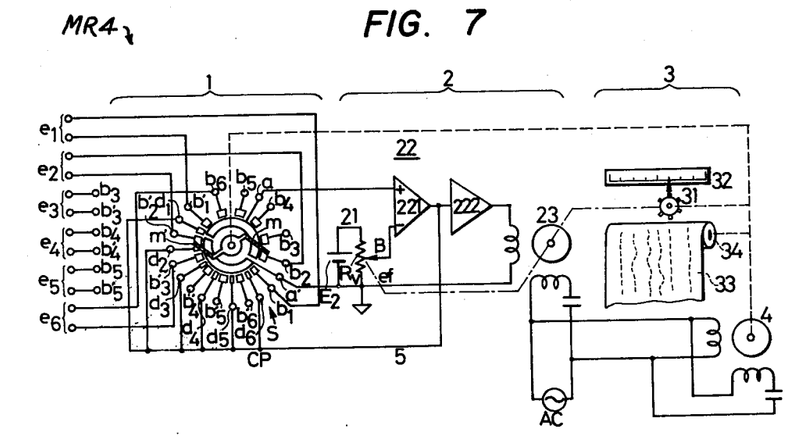
FIGS. 7 and 8 are circuit diagrams showing still other embodiments of the invention.

FIG. 7 illustrates a multipoint recorder $MR_4$ according to the invention wherein auxiliary fixed contacts $d_1$ to $d_6$ of the switch S on the printed circuit board 11 are used directly for locking the balancing motor 23. The auxiliary fixed contacts $d_1$ to $d_6$ are connected in common, and the common point $cp$ is connected to the output terminal of a voltage amplifier circuit 221 of the amplifier 22. The voltage amplifier circuit 221 amplifies the difference between a measured value and a comparison value. The balancing motor 23 is driven by the output of the power amplifier circuit 222 of the amplifier 22 according to the output of the voltage amplifier circuit 221. Therefore, each time the moveable contacts $m$ and $m'$ of the switch S come in contact with one of the auxiliary fixed contacts $d_1$ to $d_6$, the output of the voltage amplifier circuit 221 is shorted and the balancing motor 23 is locked. By using the auxiliary fixed contacts $d_1$ to $d_6$ to directly lock the balancing motor 23 in the above manner, the circuit construction can be made quite simple.

Figure 8:
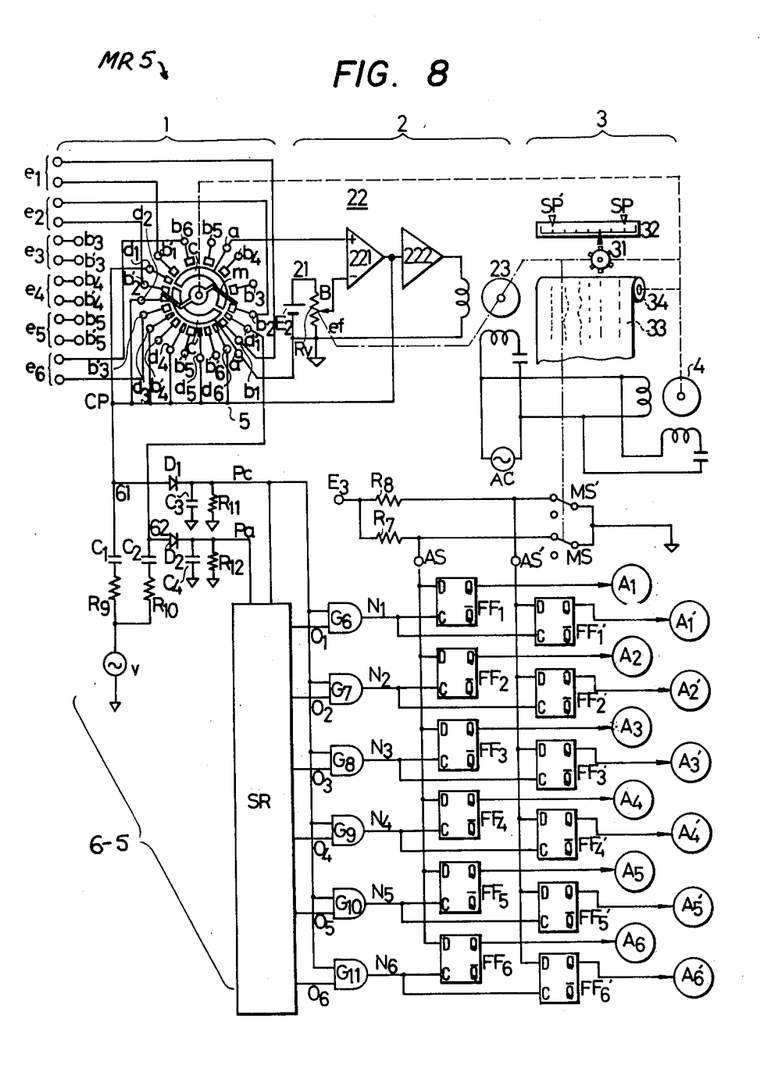
Figure 9:
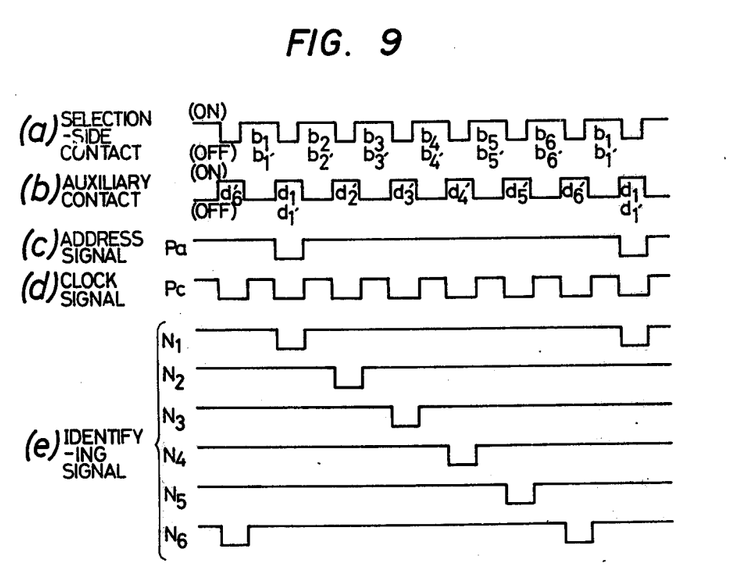
FIG. 9 is a timing chart illustrating the operation of the recorder shown in FIG. 8.

The multipoint recorder $MR_4$ of FIG. 7 is shown without an alarm. If an alarm function is desired, it may be added as in the multipoint recorders $MR_5$ and $MR_6$ shown in FIGS. 8 and 10. Multipoint recorder $MR_5$ of FIG. 8 has an alarm circuit 6-5 with a high frequency power source $v$ connected through a series resistor $R_9$ and capacitor $C_1$ to the point $cp$ at which auxiliary fixed contacts $d_1$ to $d_6$ of the selection mechanism 1 are connected in common. A potential change at a junction 61 between the capacitor C1 and the point $cp$ is rectified and smoothed by a diode $D_1$, a capacitor $C_3$ and a resistor $R_{11}$, into an alarm clock signal Pc, as shown graphically in FIG. 9(d), which is synchronized with switching of a measuring point. The high frequency power source v also is connected through a series resistor $R_{10}$ and capacitor $C_2$ to an auxiliary fixed contact $d_1$, installed between the fixed selection contacts $b_1$ and $b_2$ of the selection mechanism 1. A potential change at a junction 62 between the auxiliary fixed contact $d_1$ and the capacitor $C_2$ is rectified and smoothed by a diode $D_2$, a capacitor $C_4$ and a resistor $R_{12}$, into an alarm address signal Pa which, as shown in FIG. 9(c), is synchronized with switching of the first measuring point. The two alarm signals Pa ad Pc are effectively separated from the measured values $e_1$ through $e_6$ by using the high frequency power source v which is isolated from the self-balancing circuit 2 with the result that measurement is free of any disturbance.

The alarm signals Pa and Pc are applied to a shift register SR which receives an address signal Pa, shifts it in sequence with the clock signal Pc, and generates a corresponding output at its output terminals $O_1$ to $O_6$ in sequence. The outputs of the shift register SR are applied to input terminals of AND gates $G_6$ to $G_{11}$ respectively, and the clock signal Pc is applied in common to the other input terminals of the AND gates $G_6$ to $G_{11}$. The resultant AND gate outputs are signals $N_1$ to $N_6$ which, as shown in FIG. 9(e), identify the individual measuring points. It should be noted that because the signals $N_1$ to $N_6$ are obtained by the use of the the clock signal Pc and address signal Pa generated from the auxiliary fixed contacts of the selection mechanism 1 and by the use of the shift register SR and AND gates $G_6$ to $G_{11}$, only two wires suffice for connecting the alarm circuit 6 to the selection mechanism 1.

The identifying signals $N_1$ to $N_6$ are applied to the C input terminals of D-type flip-flops $FF_1$ to $FF_6$ and $FF_1'$ to $FF_6'$ respectively. These flip-flops are selected in sequence by the signals $N_1$ to $N_6$ and transfer the states of their D inputs to their outputs Q in sequence. Assume that the flip-flop $FF_1$ is selected by the identifying signal $N_1$. Then, if an abnormality detection signal AS is present at the D input of the flip-flop $FF_1$, this flip-flop generates an output Q and sustains this state until the state of its D input, which is given another identifying signal $N_1$ with a delay of one cycle, is transferred to its output Q. The outputs Q of the D-type flip-flops $FF_1$ to $FF_6$ and $FF_1'$ to $FF_6'$ are supplied to alarm displays $A_1$ to $A_6$ and $A_1'$ to $A_6'$ respectively where they are displayed.

Figure 10:
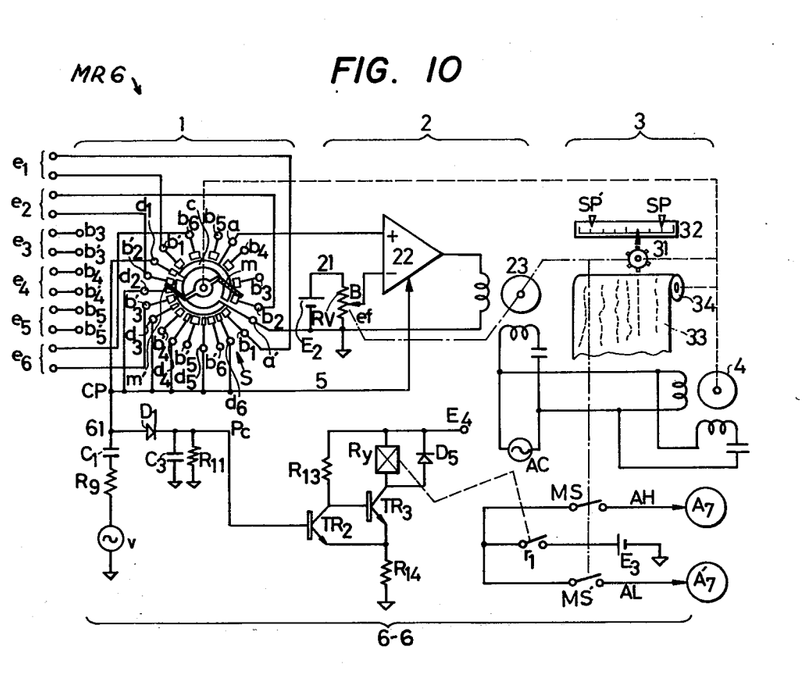
FIGS. 10 and 11 are circuit diagrams showing still other embodiments of the invention.

The alarm circuit 6-6 of multipoint recorder $MR_6$ shown in FIG. 10 has a high frequency power source v connected through a series resistor $R_9$ and capacitor $C_1$ to a point cp at which auxiliary fixed contacts $d_1$ to $d_6$ of the selection mechanism 1 are connected in common. A potential change at a junction 61 between the capacitor $C_1$ and the point cp is rectified and smoothed by a diode $D_1$, a capacitor $C_3$ and a resistor $R_{11}$, into an alarm clock signal Pc synchronous with the switching of a measuring point. This clock signal is applied to the base of a transistor $TR_2$ which has its collector connected through a resistor $R_{13}$ to a DC power source $E_4$ and its emitter connected through a resistor $R_{14}$ to a reference point. This transistor is normally on but turns off when the clock signal Pc is supplied to its base. A potential change at the collector of the transistor $TR_2$ is applied to the base of a transistor $TR_3$ which has its collector connected through a relay Ry to the DC power source $E_4$ and its emitter connected through a resistor $R_{14}$ to the reference point. Transistor $TR_3$ is normally off but turns on when the transistor $TR_2$ turns off, to cause the relay Ry to be energized. The relay Ry, when energized, causes its contact $r_1$ to close, in synchronism with the selection of one of the auxiliary fixed contacts $d_1$ to $d_6$. As shown in FIG. 10, the relay contact $r_1$ is connected between the common connection point of alarm contacts MS and MS' and a DC power source $E_3$. Hence, when a measured value exceeds a set point while the relay contact $r_1$ is on, causing the alarm contact MS (or MS') to be on, an alarm signal AH (or AL) is generated and the alarm display $A_7$ (or $A_7'$) is activated.

Figure 11:
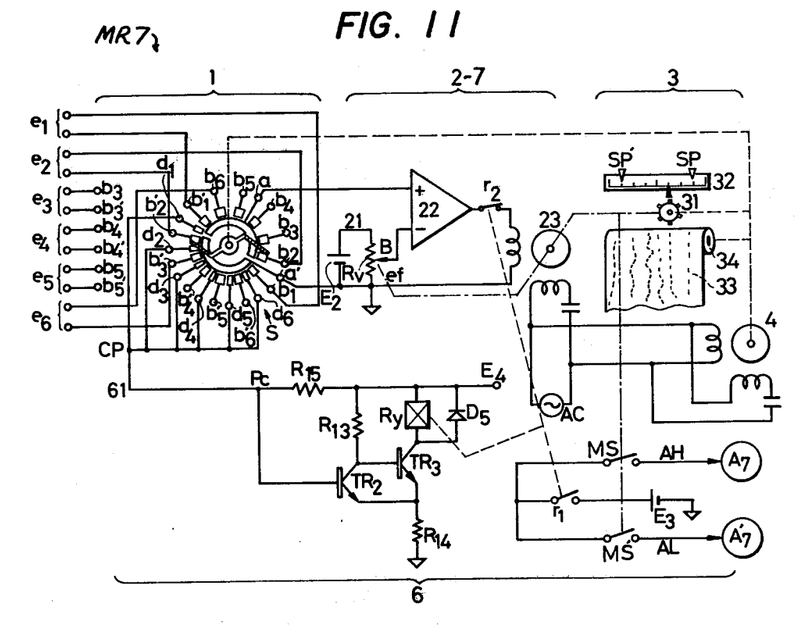

As shown in multipoint recorder $MR_7$ of FIG. 11, a normally closed contact $r_2$ may be provided on relay Ry. This contact is connected to the output terminal of the amplifier 22 in balancing circuit 2. This arrangement makes it possible to lock the balancing motor 23 through the relay Ry. In this case, the common connection point cp of the auxiliary fixed contacts $d_1$ to $d_6$ is connected through a resistor $R_{15}$ to the DC power source $E_4$, and the junction 61 is connected to the base of the transistor $TR_2$.

According to the invention, as has been described in relation to multipoint recorders $MR_1$ through $MR_7$ above, a group of auxiliary fixed contacts is placed on the same substrate on which a group of measuring point selection contacts is placed, the auxiliary fixed contacts being sequentially switchable in synchronism with switching of one measuring point to another by the measuring point selection contacts, and the operation of these auxiliary fixed contacts is utilized for locking the balancing motor, for effecting an alarm, and for other functions. Thus a multipoint recorder can be simplified in construction and yet be capable of efficiently locking the balancing motor, activating an alarm and performing other functions without the need for intricate synchronizing adjustment. Furthermore, in the recorder of the invention, the selection mechanism may be installed near the main input and output terminal part of the instrument, permitting interwirings to be simplified.

Although specific embodiments of the invention have been disclosed herein in detail, it is to be understood that this is for the purpose of illustrating the invention, and should not be construed as necessarily limiting the invention, since it is apparent that many changes can be made to the disclosed structures by those skilled in the art to suit particular applications.

We claim:

1. In a multipoint recorder of the type including a selection mechanism having a plurality of fixed measuring point contacts and a plurality of moving contacts for sequentially selecting signals from a plurality of measuring points, a self-balancing circuit including a balancing motor for intermittently measuring said signals, and an indicating and recording mechanism operated in synchronism with the selection mechanism for indicating and recording the measurements supplied from the self-balancing circuit, the improvement including:

a plurality of fixed auxiliary contacts positioned with said fixed measuring contacts in an alternating pattern such that each fixed auxiliary contact is positioned between an adjacent pair of said measuring contacts;

said measuring and switching contacts being configured in such a manner that one of said movable contacts, upon moving from a first fixed measuring point contact to a second fixed measuring point contact, will simultaneously contact said first measuring point contact and the next adjacent auxiliary contact, and subsequently simultaneously contact said next auxiliary contact and said second measuring contact; and means in circuit with said fixed auxiliary contacts for locking said balancing motor while said movable contact is in contact with said auxiliary contacts, whereby said balancing motor is automatically locked while said movable contact switches from one said measuring contact to another.

2. A multipoint recorder as claimed in claim 1 further comprising alarm means in circuit with said auxiliary contacts for performing alarm operations while the balancing motor is locked and the selection mechanism switches from one measuring point to another.

3. A multipoint recorder as claimed in claim 1 further comprising a range selection circuit responsive to said auxiliary contacts while the selection mechanism switches from one measuring point to another.

4. A multipoint recorder as claimed in claim 1 further comprising a measuring point display circuit responsive to said group of auxiliary contacts for identifying the points being measured while the selection mechanism switches from one measuring point to another.

5. A multipoint recorder as claimed in claim 1 wherein said fixed measuring point contacts and said fixed auxiliary contacts are positioned on the circumference of a circular configuration.

6. A multipoint recorder as claimed in claim 1 wherein said means for locking said balancing motor includes:
a servo amplifier comprising a voltage amplifier circuit and an output terminal for driving said balancing motor,
means for connecting all of said fixed auxiliary contacts to a common point and means for connecting said common point to said output terminal of said voltage amplifier circuit,
whereby said voltage amplifier is shorted when any of said movable contacts comes into contact with any of said auxiliary, thereby locking said balancing motor.

7. A multipoint recorder as claimed in claim 1 wherein said means for locking the balancing motor includes:
means for connecting said fixed auxiliary contacts to a common point,
a relay, said relay being driven by change of potential at said common point,
a servo amplifier, the output of said servo amplifier being short circuited when said relay is closed, thereby locking said balancing motor,
said multipoint recorder further comprising means connected to said relay for indicating when the value recorded at one of said measuring contacts exceeds a predetermined value.

8. A multipoint recorder as claimed in claim 1 wherein said means for locking said balancing motor includes:
a D.C. source and a resistor common to said fixed auxiliary contacts for generating a contact signal when one of said moving contacts is in contact with one of said fixed auxiliary contacts,
a logical circuit for converting said contact signal into a balance motor lock signal,
a transistor switch, said transistor switch being driven by said balancing motor lock signal,
a servo amplifier including a bias circuit cooperating with said transistor switch, said bias circuit locking said balancing motor when said transistor switch is driven by said balancing motor lock signal,
whereby said balancing motor is locked when any of said movable contacts is in contact with any of said fixed auxiliary contacts.

9. A multipoint recorder as claimed in claim 8 further comprising alarm means for indicating when a value recorded at one of said measuring contacts exceeds a predetermined value, said alarm means comprising a means for generating an alarm signal, said alarm signal applied to said contact signal, said alarm signal being detected by said logical circuit, and means responsive to said alarm signal for indicating an alarm condition.

10. A multipoint recorder as claimed in claim 8 further comprising alarm means for indicating when a value recorded at one of said measuring contacts exceeds a predetermined value, said alarm means including:
a high frequency power source,
a series circuit having a register and a capacitor, said high frequency power source being connected to said common point through said register and said capacitor, said register and said capacitor generating an alarm clock signal by rectifying and smoothing said contact signal produced by said fixed auxiliary contacts, and a relay, said relay being driven by said alarm clock signal when the value recorded at one of said measuring signals exceeds a predetermined value.

11. In a multipoint recorder of the type including a selection mechanism having a group of contacts for sequentially selecting signals from a number of measuring points, a self-balancing circuit having a balancing motor for intermittently measuring said signals, and an indicating and recording mechanism for indicating and recording the measurements supplied from the self-balancing circuit, the improvement including:
a group of fixed measuring point selection contacts and a group of fixed auxiliary contacts, the number of said fixed auxiliary contacts being one more than said measuring point selection contacts, and movable contacts, each of said measuring point selection contacts and each of said fixed auxiliary contacts being arranged alternately on the same circumference, so that each of said movable contacts not only can come into contact with one of the auxiliary contacts on its moving way from one to another of the selection contacts, but also can contact, at switching between one of the measuring point selection contacts and one of the fixed auxiliary contacts, with both the neighboring contacts simultaneously, and
the improvement further comprising means to connect in common the same number of said measuring point selection contacts and the same number of said auxiliary contacts,
a servo amplifier including a voltage amplifier,
means for connecting said common point of said auxiliary contacts to the output terminal of said voltage amplifier circuit of said servo amplifier, said auxiliary contacts being used to short said output, thereby locking said balancing motor,
a high frequency power source, a series circuit including a register and a capacitor,
means for connecting said common point to said high frequency power source through said series circuit for rectifying and smoothing a potential change at said common point responding to on-off operations of said auxiliary contacts, whereby an output is derived as an alarm clock signal synchronized by the switching of each measuring point, means for connecting said high frequency power source to the remainder of said auxiliary contacts through a second series circuit including a second register and a second capacitor for rectifying and smoothing a potential change at this auxiliary contact, whereby an output is derived as an address alarm signal synchronized by the switching of a specified measuring point, a shift register for shifting said address signal received as an input in sequence with said clock signal, and means for identifying the individual measuring points through each output of said shift register and said clock signal, thereby performing alarm operations when a measured value at one of said measuring points exceeds a predetermined value.

* * * * *